(12) United States Patent
Chaabouni et al.

(10) Patent No.: US 8,274,139 B2
(45) Date of Patent: Sep. 25, 2012

(54) SCALLOPED TUBULAR ELECTRIC VIA

(75) Inventors: Hamed Chaabouni, Grenoble (FR); Lionel Cadix, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 95 days.

(21) Appl. No.: 12/831,357

(22) Filed: Jul. 7, 2010

(65) Prior Publication Data

US 2011/0018139 A1    Jan. 27, 2011

(30) Foreign Application Priority Data

Jul. 21, 2009  (FR) ...................................... 09 55055
Jun. 22, 2010  (EP) ...................................... 10166935

(51) Int. Cl.
*H01L 29/40*    (2006.01)

(52) U.S. Cl. . 257/621; 257/698; 257/774; 257/E23.011; 257/E23.174; 257/E21.597; 438/667

(58) Field of Classification Search .................. 257/621, 257/698, 774, E23.011, E23.174, E21.597; 438/667

See application file for complete search history.

(56) References Cited

U.S. PATENT DOCUMENTS

| 2006/0043598 | A1 | 3/2006 | Kirby | |
|---|---|---|---|---|
| 2007/0290300 | A1 | 12/2007 | Kawakami | |
| 2008/0073747 | A1* | 3/2008 | Chao et al. | 257/520 |
| 2009/0014891 | A1 | 1/2009 | Chang | |
| 2010/0200989 | A1* | 8/2010 | Sprey et al. | 257/741 |

FOREIGN PATENT DOCUMENTS

| DE | 10323394 A1 | 12/2004 |
|---|---|---|
| EP | 1427006 A1 | 6/2004 |
| EP | 1892757 A1 | 2/2008 |
| FR | 2901636 A1 | 11/2007 |

* cited by examiner

*Primary Examiner* — Tu-Tu Ho
(74) *Attorney, Agent, or Firm* — The Noblitt Group, PLLC

(57) ABSTRACT

A via connecting the front surface of a substrate to its rear surface and having, in cross-section in a plane parallel to the surfaces, the shape of a scalloped ring.

8 Claims, 2 Drawing Sheets

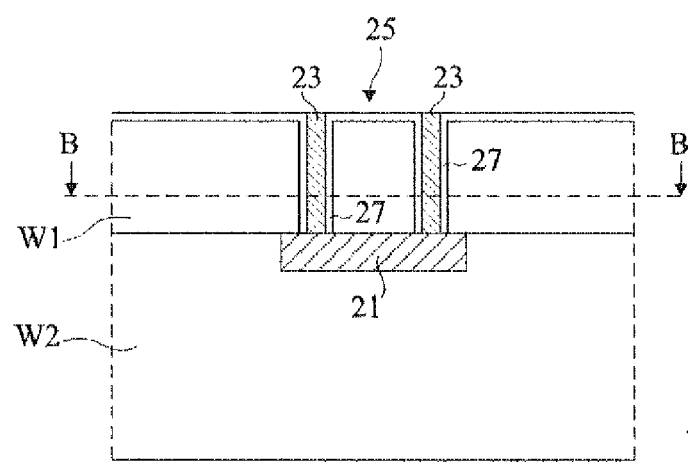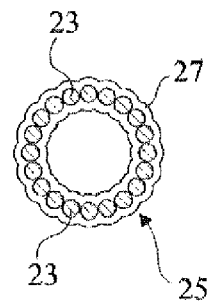
Fig 3A     Fig 3B
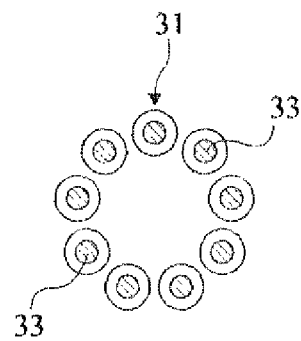
Fig 4

SCALLOPED TUBULAR ELECTRIC VIA

BACKGROUND OF THE INVENTION

1. Field of the Invention

The present invention relates to an insulated electrical connection via connecting a front surface of a substrate to a single contact pad arranged on the rear side of the substrate, currently called via in the art.

2. Discussion of the Related Art

Among the many fields of use of vias, chip stack devices may be mentioned. In such devices, it is provided to superpose semiconductor wafers or chips above one another. This enables to increase the functions carried out by a device without increasing the occupied surface area.

In such devices, the connections between components of the different stages may be formed either by conventional wiring techniques, or by vias crossing the chip substrate.

An advantage of vias is the possibility of a collective manufacturing thereof, conversely to wires which must be assembled individually. The other main advantages of vias over wires are a surface gain, and the possibility of a surface distribution of the inputs/outputs. Another advantage of the connection by vias is that such vias will currently be made in silicon wafers. The silicon wafers will then assembled in various ways, among which that described hereafter, to be eventually diced into individual chips. Such collective methods provide cost reductions. In the present description, chip assemblies will be mentioned, but it should be clear that the chips may be wafers, semiconductor wafers or elements of semiconductor wafers.

FIGS. 1A and 1B are side cross-section views illustrating steps of a method for forming a solid via having a diameter smaller than 10 μm, for example, on the order of from 0.5 to 10 μm. FIG. 1C is a top cross-section view along plane C-C of FIG. 1B and shows a section of the formed via.

A thinned-down semiconductor wafer or chip W1 is superposed to a semiconductor wafer or chip W2. Chips W1 and W2 are for example bonded together by molecular bonding. The thinning down of chip W1 may be performed before or after the bonding. Chips W1 and W2 are each formed in a semiconductor substrate, according to conventional methods. They especially each comprise active areas, in which components are formed, and a stack of conductive interconnect tracks, for example, copper tracks, connecting the components together and to the inputs-outputs. At the surface of chip W2, on the surface side common to chips W1 and W2, a conductive contact pad 1 is provided, for example corresponding to a copper portion of an upper interconnect level. Contact pad 1 is connected to a terminal of the chip by conductive tracks, not shown, to be able to be connected to a reference voltage in a subsequent electrolytic deposition step.

A hole 3, thoroughly crossing the substrate of chip W1, is formed in front of contact pad 1. Hole 3 may be bored by dry etch or chemical etch. The walls of hole 3 are insulated, for example, by deposition of a silicon oxide layer 5. The portion of insulating layer 5 covering, at the bottom of hole 3, contact pad 1, is removed to leave access to pad 1.

The assembly thus formed is dipped into an adapted conductive electrolytic solution, for example copper sulfide. Contact pad 1 is set to a negative voltage and forms a cathode. A copper anode, connected to a positive voltage, is dipped into the electrolytic solution. A current thus flows between the anode and the cathode. Copper progressively deposits by electrolysis on the cathode, thus filling hole 3. The electrolysis is interrupted when hole 3 is full, thus forming a cylindrical via 7. A planarization step may further be provided to level the surface of via 7 after the electrolysis.

For diameters greater than a few μm, the forming of vias by electrolysis would be too long and too expensive to implement.

FIGS. 2A and 2B are side cross-section views illustrating steps of the forming of a hollow via having a diameter greater than 10 μm, for example, on the order of from 10 to 200 μm. FIG. 2C is a top cross-section via along plane C-C of FIG. 2B, and shows a cross-section of the formed via.

Semiconductor wafers or chips W1 and W2 are superposed as described hereabove. At the surface of chip W2, on the side of the surface common to chips W1 and W2, a conductive contact pad 11 is provided, for example corresponding to a copper portion of an upper interconnect level.

A hole 13 thoroughly crossing chip W1 is bored in front of pad 11. A sheath for insulating the walls of hole 13 is formed, for example, by deposition of a silicon oxide layer 15. The portion of insulating layer 15 covering contact pad 11 is removed to leave access to pad 11.

A conductive layer 17, for example, a copper layer, is formed by conformal deposition on the insulated walls and on the bottom of hole 13. Layer 17 forms a contact with pad 11 of chip W2.

The portions of layer 17 at the surface of chip W1 are removed to only keep the portion applied on the insulated walls and on the bottom of hole 13. The remaining portion of layer 17 thus forms a tubular via 17, which is ring-shaped in top view.

Via 17 is generally filled with a filling resin 19.

Tubular vias having diameters on the order of a few tens of μm, of the type described in relation with FIGS. 2A to 2C, are here considered.

In operation, when vias conduct currents, they generate heat by Joule effect. This results in a rise of their temperature, which may cause damage or a decrease in the chip lifetime.

Further, under the effect of temperature variations, resin 19 filling the vias is capable of deforming and of forming blisters.

SUMMARY OF THE INVENTION

An embodiment of the present invention overcomes all or part of the disadvantages of conventional tubular vias.

An embodiment of the present invention provides a tubular via structure enabling to limit the temperature rise of the via when it conducts a current.

Thus, an embodiment of the present invention provides a via connecting the front surface of a substrate W1 to the rear surface thereof, having, in cross-section in a plane parallel to the surfaces, the shape of a scalloped ring.

According to an embodiment of the present invention, said ring is discontinuous.

According to an embodiment of the present invention, the above-mentioned via comprises a plurality of elementary vias, each having the shape of a solid cylindrical rod.

According to an embodiment of the present invention, the elementary vias each have a cross-section of a diameter ranging between 0.5 and 10 μm.

According to an embodiment of the present invention, the above-mentioned via has a cross-section of a diameter ranging between 10 μm and 200 μm.

According to an embodiment of the present invention, the via is insulated from the substrate by an electrically-insulating material.

According to an embodiment of the present invention, the electrically-insulating material is thermally conductive.

An embodiment of the present invention provides a method for forming a via connecting the front surface of a substrate to the rear surface thereof, comprising the steps of: boring a plurality of holes thoroughly crossing the substrate and arranged, in top view, in a ring; and filling said holes with a conductive material.

According to an embodiment of the present invention, the above-mentioned method comprises a step of insulation of the walls of said holes before the filling step.

According to an embodiment of the present invention, a conductive contact pad is placed against a surface of the substrate, in front of the plurality of holes, and the filling of the holes is performed by electrodeposition, the pad forming an electrolysis terminal.

The present invention will be discussed in detail in the following non-limiting description of specific embodiments in connection with the accompanying drawings.

BRIEF DESCRIPTION OF THE DRAWINGS

FIG. 3A is a side cross-section view illustrating an embodiment of a via having a diameter greater than 10 µm, for example, on the order of from 10 to 200 µm.

FIG. 3B is a cross-section view along plane B-B of FIG. 3A.

FIG. 4 is a top view illustrating another embodiment of a via having a diameter greater than 10 µm.

DETAILED DESCRIPTION

Figure 1A:
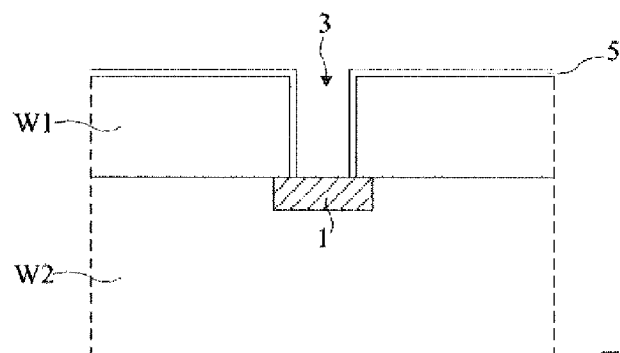
FIGS. 1A and 1B, previously described, are side cross-section views illustrating steps of the forming of a solid via having a diameter smaller than 10 µm.

For clarity, the same elements have been designated with the same reference numerals in the different drawings and, further, as usual in the representation of integrated circuits, the various drawings are not to scale.

The inventors have studied the dissipation of the heat generated in a via.

A first part of the heat propagates from the top and from the bottom of the via towards the chip interconnect tracks. However, the dissipation surface area provided by the interconnect tracks is small. Further, insulating layers, generally made of silicon oxide, are interposed between the successive interconnect levels. As a result, the heat dissipation via the interconnect tracks is low.

A second part of the heat is dissipated from the lateral external surface of the via through the insulating sheath, into the substrate bulk. However, the low thermal conductivity of the conductive sheath limits the heat dissipation in the substrate bulk.

The thermal exchanges between a via and the bulk of the substrate that it crosses are here desired to be improved to decrease the temperature rise of the via.

The heat generated by Joule effect is directly proportional to the via resistance. Thus, of course, the solutions provided by the inventors must be compared with prior art solutions of equal resistance, that is, in the case of copper vias of same height, with vias of same volume.

FIG. 3A is a side cross-section view illustrating an embodiment of a via having a diameter smaller than 10 µm, for example, on the order of from 10 to 200 µm. FIG. 3B is a cross-section view along plane B-B of FIG. 3A.

Figure 1B:
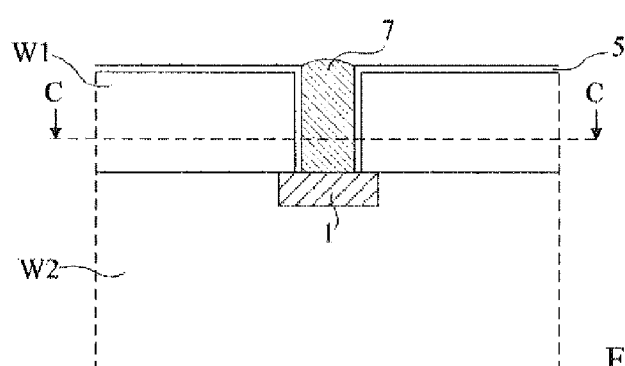

A thinned-down semiconductor wafer or chip W1 is superposed to a semiconductor wafer or chip W2 as described in relation with FIGS. 1A and 1B. At the surface of chip W2, on the side of the surface common to chips W1 and W2 (i.e the rear surface side of substrate W1), a single conductive contact pad 21, for example corresponding to a copper portion of an upper interconnect level, is provided. Contact pad 21 is connected to a terminal of the chip by conductive tracks, not shown, to be able to be connected to a reference voltage in an electrolysis step during the via manufacturing.

Several elementary solid vias 23 thoroughly cross the substrate of chip W1 (from the front, i.e. top surface to the rear surface) to form a tubular via 25 substantially extending to the front surface of single contact pad 21, thereby connecting the front surface of the substrate W1 to the front surface of the pad 21. Elementary vias 23 have a much smaller diameter than tubular via 25. As an example, the tubular via may have a diameter on the order of from 10 to 200 µm and the elementary vias may have a diameter on the order of 1 µm. Elementary vias 23 are arranged, in top view, in a ring, which is circular in the shown case. In the example shown in FIG. 3B, elementary vias 23 are placed against one another (contacting each other) and form a tubular via 25 with scalloped lateral walls. An insulating layer 27, for example, silicon oxide, insulates via 25 from the substrate.

Figure 1C:
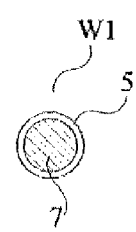
FIG. 1C, previously described, is a top cross-section view of FIG. 1B showing a cross-section of a solid via.
Figure 2A:
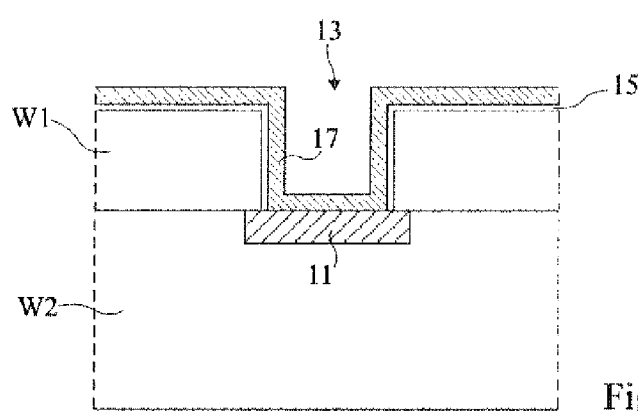
FIGS. 2A and 2B, previously described, are side cross-section views illustrating steps of the forming of a tubular via having a diameter greater than 10 µm.
Figure 2B:
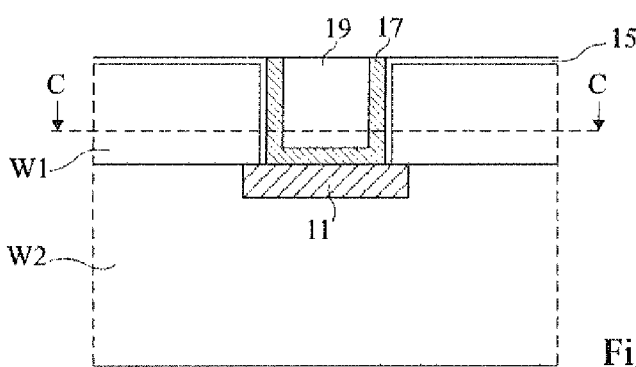
Figure 2C:
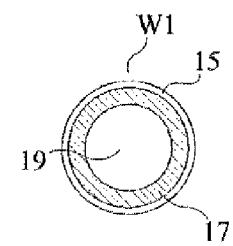
FIG. 2C, previously described, is a top cross-section view of FIG. 2B showing a cross-section of a tubular via.

In this example, vias 23 are filled by electrolysis, according to the method described in relation with FIGS. 1A to 1C, with the sole difference that instead of a single hole being bored in the substrate, a plurality of holes placed against one another, arranged in a ring in top view, are bored to form a tube with scalloped walls. As an example, the holes may be formed by reactive ion etching RIE.

An advantage of the provided embodiment is that, due to the scalloping, the contact surface area between the via and the silicon oxide insulating layer is increased with respect to prior art vias having the shape of a straight cylinder with a circular cross-section. This results in an increase of thermal exchanges between the via and the chip substrate. This limits the temperature rise of the via and the associated damage risks.

Another advantage of the provided structure is that the volume comprised within the scalloped tube is formed of the substrate material, currently silicon, and not of a filling resin. Thus, the constraint variations due to the temperature variations are the same inside and outside of the via. No blisters thus form as in the case of conventional vias.

FIG. 4 is a top cross-section view showing another embodiment of a via having a diameter greater than 10 µm, for example on the order of from 10 to 200 µm. FIG. 4 shows a cross-section of a via along the same plane as FIG. 3B.

Via 31 is similar to via 25 of FIGS. 3A and 3B. The only difference is that elementary vias 33 forming it are not placed side by side in contact with each other. Rather, vias 33 are spaced apart from each other. Thus, via 31 has, in top view, the shape of a discontinuous scalloped ring.

Specific embodiments of the present invention have been described. Various alterations and modifications will occur to those skilled in the art.

In particular, the via diameters mentioned in the description are given as an example only. It will be within the abilities of those skilled in the art to implement the desired operation for other diameters.

Further, the present description mentions copper vias and interconnection tracks. However, the present invention is not limited to this specific case. It will also be within the abilities of those skilled in the art to implement the desired operation by using other conductive metals or materials, for example, heavily-doped polysilicon, to form the conductive portion of the vias.

Further, the present invention is not limited to methods for forming the conductive portion of the via by electrodeposition, such as mentioned hereabove. As an example, the conductive portion of the via may be deposited by chemical vapor deposition of polysilicon. This silicon will be heavily doped to be made conductive.

Similarly, it will be within the abilities of those skilled in the art to implement the desired operation whatever the insulating materials used to form the various insulating layers mentioned in the description. In particular, it will be within the abilities of those skilled in the art to advantageously do without a via insulation sheath in the case of an insulating substrate. Further, in the case of a conductive substrate, to further improve thermal exchanges between a via and the substrate, the sheath may be formed of an electrically-insulating but thermally-conductive material.

Moreover, to improve thermal exchanges, a via having an external lateral surface exhibiting irregularities may be provided to further increase the contact surface area between this via and the insulating sheath.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electrical connection connecting a front surface of a substrate to a single contact pad arranged on the rear surface side of the substrate, said via comprising a plurality of elementary vias each having the shape of a solid cylindrical rod, the elementary vias being disposed in cross-section in a plane parallel to the surfaces, according to a ring wherein, in cross-section in a plane parallel to the surfaces, the elementary vias are contacting each other.

2. The via of claim 1, wherein the elementary vias each have a cross-section of a diameter ranging between 0.5 and 10 μm.

3. The via of claim 1, having a cross-section of a diameter ranging between 10 μm and 200 μm.

4. The via of claim 1, insulated from the substrate by an electrically-insulating material.

5. The via of claim 4, wherein the electrically-insulating material is thermally conductive.

6. A method for forming an electrical connection via connecting the front surface of a substrate to a single contact pad arranged on the rear surface side of the substrate, comprising the steps of: boring a plurality of holes thoroughly crossing the substrate and connecting the front surface to the pad, said holes being arranged, in top view, in a ring; and filling said holes with a conductive material, wherein, in cross-section in a plane parallel to the surfaces, the holes with the conductive material are contacting each other.

7. The method claim 6, comprising a step of insulation of the walls of said holes before the filling step.

8. The method of claim 6, wherein the filling of the holes is performed by electrodeposition, the pad forming an electrolysis terminal.

* * * * *

UNITED STATES PATENT AND TRADEMARK OFFICE
CERTIFICATE OF CORRECTION

PATENT NO.       : 8,274,139 B2
APPLICATION NO.  : 12/831357
DATED            : September 25, 2012
INVENTOR(S)      : Hamed Chaabouni et al.

Page 1 of 1

It is certified that error appears in the above-identified patent and that said Letters Patent is hereby corrected as shown below:

In the Claims:

In Col. 6, line 2, claim 1, after "connection" insert --via--.

Signed and Sealed this
Seventeenth Day of December, 2013

Margaret A. Focarino
*Commissioner for Patents of the United States Patent and Trademark Office*